(12) United States Patent
Shih et al.

(10) Patent No.: US 6,277,723 B1
(45) Date of Patent: Aug. 21, 2001

(54) PLASMA DAMAGE PROTECTION CELL USING FLOATING N/P/N AND P/N/P STRUCTURE

(75) Inventors: Jiaw-Ren Shih; Shui-Hung Chen; Jian-Hsing Lee, all of Hsin-Chu; Chrong Jung Lin, Hsin-Tien, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/418,030

(22) Filed: Oct. 14, 1999

(51) Int. Cl.[7] .................................................. H01L 21/44
(52) U.S. Cl. .......................... 438/597; 438/720; 438/669; 438/707; 438/709; 438/742; 257/356; 257/360; 257/361
(58) Field of Search ..................................... 438/720, 597, 438/669, 926, 622, 707, 709, 710, 712, 719, 742; 257/356, 360, 361

(56) References Cited

U.S. PATENT DOCUMENTS

| | | | |
|---|---|---|---|
| 5,416,351 | * 5/1995 | Ito et al. | 257/357 |
| 5,510,282 | * 4/1996 | Haga | 437/43 |
| 5,700,711 | * 12/1997 | Hsu et al. | 437/60 |
| 5,882,967 | * 3/1999 | Brown et al. | 458/237 |
| 5,900,664 | * 5/1999 | En | 257/356 |
| 5,994,742 | * 11/1999 | Krishnan et al. | 257/355 |
| 6,013,927 | * 1/2000 | Bothra et al. | 257/328 |
| 6,093,626 | * 7/2000 | Su et al. | 438/532 |
| 6,150,261 | * 11/2000 | Hsu et al. | 438/640 |

* cited by examiner

Primary Examiner—Matthew Smith
Assistant Examiner—Victor V. Yevsikov
(74) Attorney, Agent, or Firm—George O. Saile; Stephen B. Ackerman; Sevgin Oktay

(57) ABSTRACT

A plasma damage protection cell using floating N/P/N and P/N/P structure, and a method to form the same are disclosed. Floating structures of the protection cell and the floating gates for the MOS devices are formed simultaneously on a semiconductor substrate having shallow trench isolation. The floating structures are implanted separately to form the N/P/N and P/N/P bipolar base, emitter and collector regions while the source/drain of the respective NMOS and PMOS devices are implanted with appropriate sequencing. The floating structures are connected to the substrate with appropriate polarity to provide protection at low leakage current levels and with tunable punch-through voltages.

10 Claims, 6 Drawing Sheets

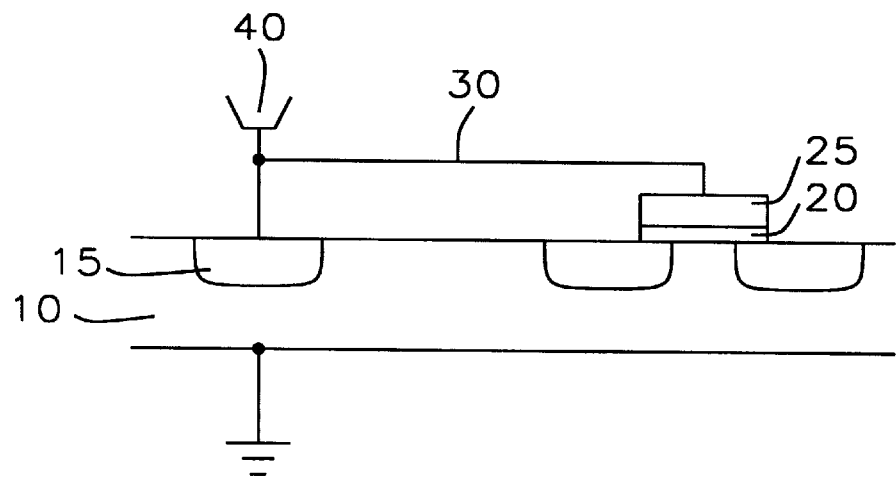
*FIG. 1a – Prior Art*
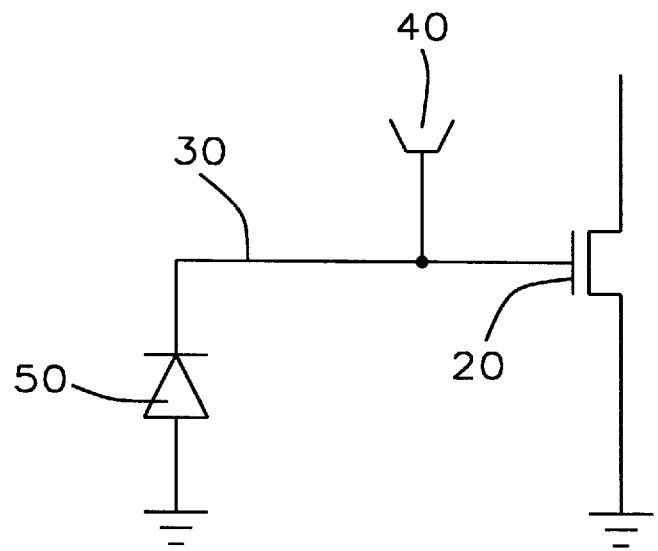
*FIG. 1b – Prior Art*

US 6,277,723 B1

PLASMA DAMAGE PROTECTION CELL USING FLOATING N/P/N AND P/N/P STRUCTURE

BACKGROUND OF THE INVENTION (1) Field of the Invention

The present invention relates to the manufacture of very large (VLSI) and ultra large scale integrated (ULSI) circuits, and more particularly to the forming of a floating N/P/N and P/N/P structure used to protect circuits from plasma damage during the manufacture of the same.

(2) Description of the Related Art

It is known in the art of integrated circuit fabrication that metal or polysilicon lines are typically used to interconnect devices. The interconnections are formed by etching lines from blanket conductor layers. Usually plasma etch methods, such as but not limited to microwave plasma etch methods, reactive ion etch (RIE) plasma etch methods, magnetically enhanced reactive ion etch (MERIE) plasma etch methods and electron cyclotron resonance (ECR) plasma etch methods, are used for etching a blanket conductor layer to form a patterned conductor layer within an integrated circuit. It is also known that when blanket conductor layer and any other integrated circuit layers are exposed to the plasma etch method, they will typically become electrically charged. These metal or polysilicon layers and/or long interconnect lines which act like antennas, that may accumulate charge during plasma etching may be connected to the gate of the integrated circuit device. Because of the relatively high capacitance of the MOS devices, charge build-up occurs disproportionately at the gate of the MOS device. This plasma etch charge build-up can cause damage to the very thin gate oxide of the device. The detrimental effects of plasma charging are well known in the field. These include the formation of electron traps in gate oxide and displaced and implanted atoms at the material surface due to ion bombardment. The trapped charges decrease breakdown voltage of the oxide and if not annealed out, can cause shift in the threshold voltage resulting in reliability failures. Further, the surface states formed at the oxide-semiconductor interface degrade transistor characteristics such as subthreshold slope, transconductance, and device lifetime under hot electron stress. It is disclosed later in the embodiments of the present invention a plasma damage protection cell using floating N/P/N and P/N/P structure.

In prior art, several methods have been employed to protect devices against plasma damage. Diaz in U.S. Pat. No. 5,760,445 describes a protection device connected to a gate to minimize charge build-up during plasma processing. Thus in FIG. 1a, polysilicon gate (25), covering gate oxide (20) of the device to be protected is connected to an N-island (15) in a P-substrate (10) via metal line (30). The charge collecting material is represented by antenna (40). The N-island (15) and P-substrate (10) form diode (50) as shown schematically in FIG. 1b. As positive charge is deposited on gate oxide (20), excess charge accumulated on gate flows through diode (50). However, the diode breakdown voltages are generally greater than the failure voltages of the thin oxide they are protecting, rendering diode protection ineffective. To provide sufficient protection, larger area is needed.

Diaz in U.S. Pat. No. 5,760,445 shows an improved protection device which protects against charge build-up on a thin oxide gate during plasma etching. The protection device is described as a floating well PMOS device. When the PMOS transistor is formed, a lateral parasitic PNP transistor is formed. In the lateral PNP device the base is floating, the collector is connected to ground and the emitter is connected to the gates of the host PMOS protection device and the device to be protected. In operation, the gate of the PMOS transistor is tied to the source of the PMOS transistor so tat the PMOS transistor is off. Thus, the lateral PNP transistor controls the charging and discharging of the charge stored on the gate oxide. Excessive charge build-up is prevented by the breakdown voltage of the lateral PNP transistor. Because protection is achieved by PNP breakdown operation, the size of the PNP protection device can be substantially smaller than other protection devices.

In U.S. Pat. Nos. 5,866,482 and 5,767,006, Lee discloses the use of a blanket conductive layer to reduce charge damage. The conductive layer is formed over a semiconductor substrate. The blanket conductor layer communicates electrically with the semiconductor substrate in a manner such that an electrical charge is shunted form the blanket conductor layer into the semiconductor substrate when the blanket conductor layer is patterned to from the patterned conductor layer through the plasma etch method.

Su, et al., in U.S. Pat. No. 5,691,234, on the other hand, disclose a buried contact method to release plasma-induced charging damage on a device. In their method, a semiconductor substrate having a first conductivity type is provided. An oxide layer is formed in the oxide layer. A polysilicon layer is formed over the oxide layer and in the opening. A diffusion region is formed in the semiconductor substrate, connected to the polysilicon layer through the opening, having a second conductivity type opposite to the first conductivity type, whereby a buried contact is formed. The buried contact is connected, through the substrate, to a ground reference. Further processing in a plasma environment is performed that would normally produce charging damage to the integrated circuit; however, the buried contact prevents the charging damage.

Another method to provide tunnel oxide protection is disclosed by Cappelletti in U.S. Pat. No. 5,466,622. To form the protective diodes, a first polysilicon layer (poly1) is removed from the active areas in which the diodes are to be formed, using the same mask employed for shaping the poly1. Next, the interpoly dielectric layer and the gate oxide layer are removed from the active areas of the diodes, using the same mask employed for removing the dielectric layer from the transistor area. A second polysilicon layer (poly2) is deposited directly on to the active areas of the diodes; and the poly2 doping ions penetrate the active areas to form N+ regions which, together with the substrate, constitute the protection diodes.

In the present invention, a plasma damage protection cell with a floating N/P/N and P/N/P structure is disclosed which is tunable for different punch-through voltage levels and which provides low leakage.

SUMMARY OF THE INVENTION

It is therefore an object of this invention to provide a method of forming a plasma damage protection cell.

It is another object of this invention to provide a method of forming a floating N/P/N and P/N/P structure to serve as a plasma damage protection device.

It is still another object of this invention to provide a plasma damage protection cell using a floating N/P/N and P/N/P structure.

These objects are accomplished by providing a silicon substrate having a plurality of active and field regions defined; forming shallow trench isolation (STI) in said substrate; forming a gate oxide layer over said substrate; forming a polysilicon layer over said gate oxide layer; performing thin-film bipolar P-base implant; forming a polysilicon floating structure over said STI and a polysilicon floating gate over said gate oxide adjacent said STI; performing thin-film bipolar N-base implant; performing N/P lightly doped drain (LDD) implant; forming oxide spacer; performing N+ source/drain (S/D) and N+ emitter/collector (E/C) implant; performing P+ source/drain (S/D) and P+ emitter/collector (E/C) implant; forming inter-level dielectric layer and performing chemical-mechanical polishing (CMP); and forming contact pattern.

The objects of the present invention are further accomplished by providing a plurality of shallow trench isolation (STI) regions in a semiconductor substrate; an N/P/N floating structure partially covering said shallow trench isolation region, and partially N+ drain; said N/P/N floating structure having a base portion, an emitter portion, and a collector portion; a P/N/P floating structure partially covering said shallow trench isolation region, and partially P+ drain; said P/N/P floating structure having a base portion, an emitter portion, and a collector portion; an NMOS device protected by said N/P/N floating structure; and a PMOS device protected by said P/N/P floating structure.

BRIEF DESCRIPTION OF THE DRAWINGS

FIG. 1a shows a cross-sectional view of a prior art thin oxide plasma protection diode.

FIG. 1b shows a schematic representation of the prior art charge protection diode of FIG. 1a.

DESCRIPTION OF THE PREFERRED EMBODIMENTS

Figure 2A:
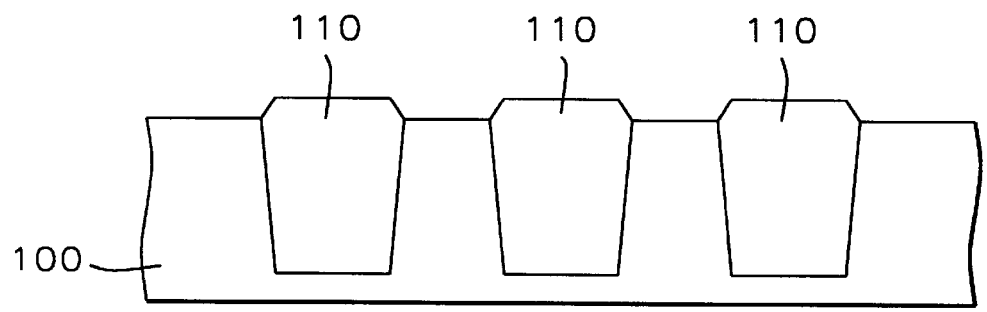
FIG. 2a is a cross-sectional view of a portion of a semiconductor substrate showing the forming of trench isolation regions, according to the present invention.
Figure 2B:
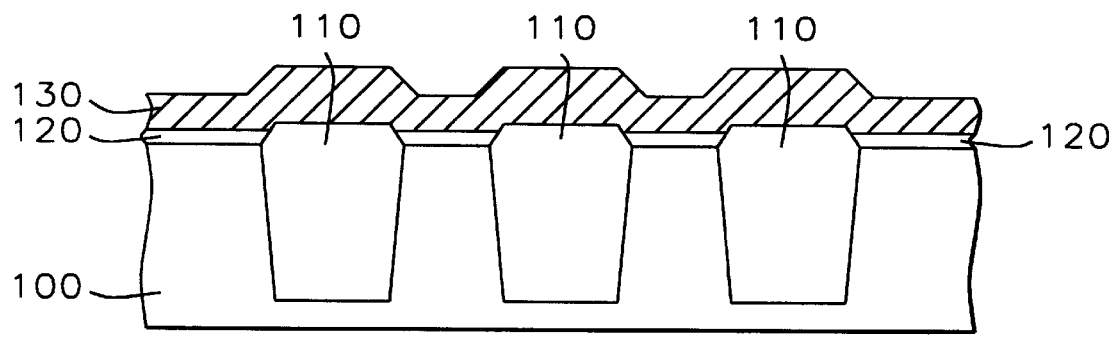
FIG. 2b is a cross-sectional view of a portion of a semiconductor substrate showing the gate oxidation and the forming of polysilicon layer over the substrate of FIG. 2a, according to the present invention.

Referring now to the drawings, in particular to FIGS. 2a–2k, there are shown schematically steps of forming a floating N/P/N and P/N/P structure to serve as a plasma damage protection device for NMOS and PMOS transistors.

In FIG. 2a, substrate (100), preferably silicon, is provided within and upon whose surface is formed isolation regions (110) which define the active region of the semiconductor substrate (100). Although the present invention may be practiced upon a semiconductor substrate of various dopant concentrations, either dopant polarity and various crystallographic orientation, the present invention is typically practiced upon a P- or N-semiconductor substrate having a (100) crystallographic orientation.

Isolation regions may in general be formed upon a semiconductor substrate through methods including but not limited to methods whereby portions of the semiconductor substrate exposed through a suitable mask are thermally oxidized to from isolation regions and methods whereby a suitable insulating material is formed upon the surface of the semiconductor substrate and patterned to form isolation regions. For the embodiment of the present invention, isolation regions (110) are preferably formed through a non-LOCOS (Local oxidation of Silicon) method, where trenches are formed in the substrate and then filled with an isolation oxide. It is preferred that trench (110) has a depth between about 2000 to 8000 Å.

Also shown in FIG. 2a is gate oxide layer (120) formed upon the active region of substrate (100). Methods through which gate oxide layers may be formed are conventional to the art. Gate oxides may be formed trough methods including but not limited to methods whereby the surface of the active region of a semiconductor substrate is oxidized to form a gate oxide, and methods whereby a layer of gate oxide material is deposited upon the surface of the active region of a semiconductor substrate. For the embodiment of the present invention, the preferred method of forming the gate oxide is by thermal oxidation in a dry oxygen carried out in an oxidation furnace in a temperature range between about 600 to 900° C. Alternatively, other oxidation methods can be used, such as oxidation in a dry oxygen and anhydrous hydrogen chloride in an atmospheric or low pressure environment, or low temperature, high-pressure, and the like.

Next, polysilicon layer (130) is formed on substrate (100) through methods including but not limited to Low Pressure Chemical Vapor Deposition (LPCVD) methods, Chemical Vapor Deposition (CVD) methods and Physical Vapor Deposition (PVD) sputtering methods employing suitable silicon source materials, preferably formed through a LPCVD method employing silane $SiH_4$ as a silicon source material at a temperature range between about 400 to 700° C. The preferred thickness is between about 1000 to 3000 angstroms (Å).

Figure 2C:
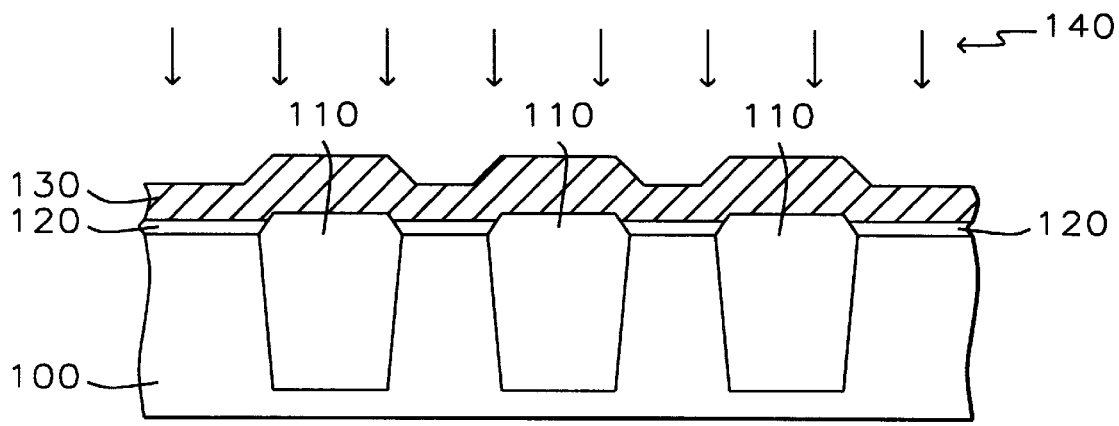
FIG. 2c is a cross-sectional view of a portion of a semiconductor substrate of FIG. 2b showing the thin-film bipolar P-base implant, according to the present invention.
Figure 2D:
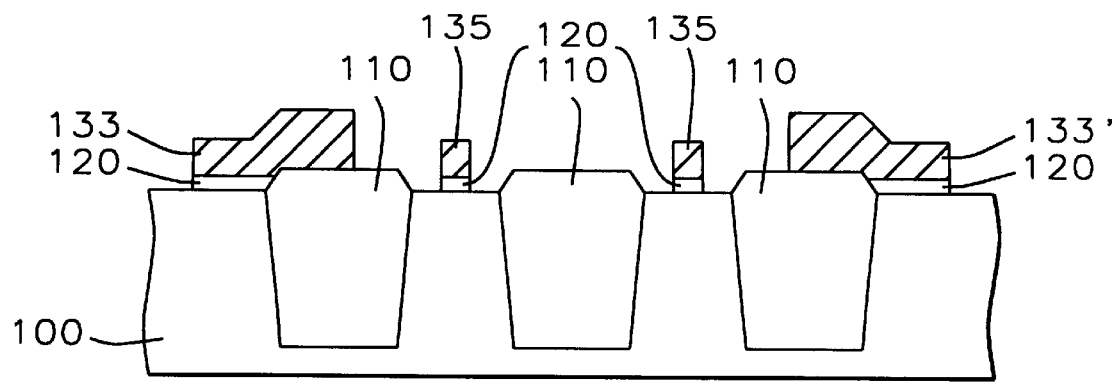
FIG. 2d is a cross-sectional view of a portion of a semiconductor substrate showing the forming of the floating structure of the protective device and the floating gate of the MOS device, according to the present invention.

Next, polysilicon layer (130) is implanted (140) with ions $BF_2$ at a dosage level between about $1\times10^{13}$ to $1\times10^{15}$ atoms/cm$^2$ and energy level between about 2 to 10 KeV to form floating bipolar P-base (133) as shown in FIG. 2c. As a main feature and key aspect of the present invention, this will form the base of the protective thin-film bipolar device for the NMOS and PMOS cell to be formed at later steps. The thin-film bipolar device is defined through the use of a photoresist mask not shown in FIG. 2d. At the same time, floating gate (135) of NMOS and PMOS cells are defined as shown in the same FIG. 2d.

Figure 2E:
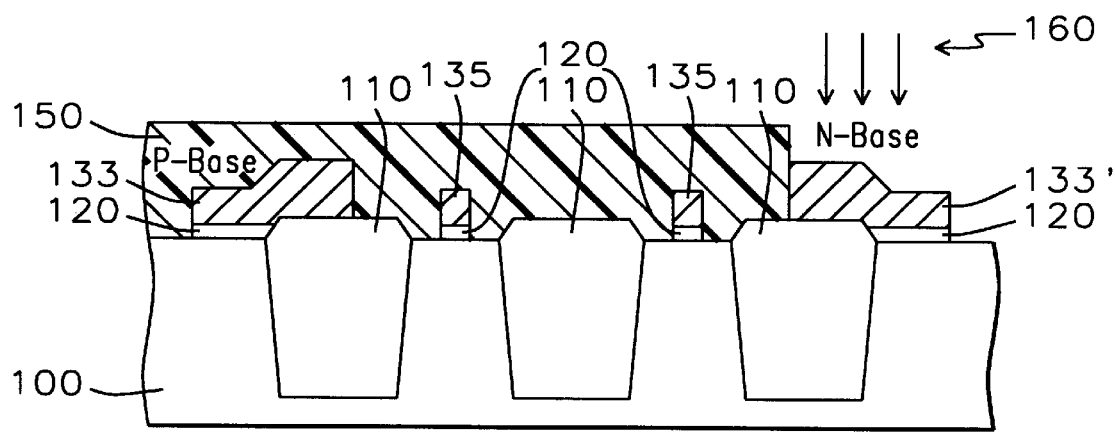
FIG. 2e is a cross-sectional view of a portion of a semiconductor substrate showing the defining of the thin-film bipolar N-base structure, according to this invention.
Figure 2F:
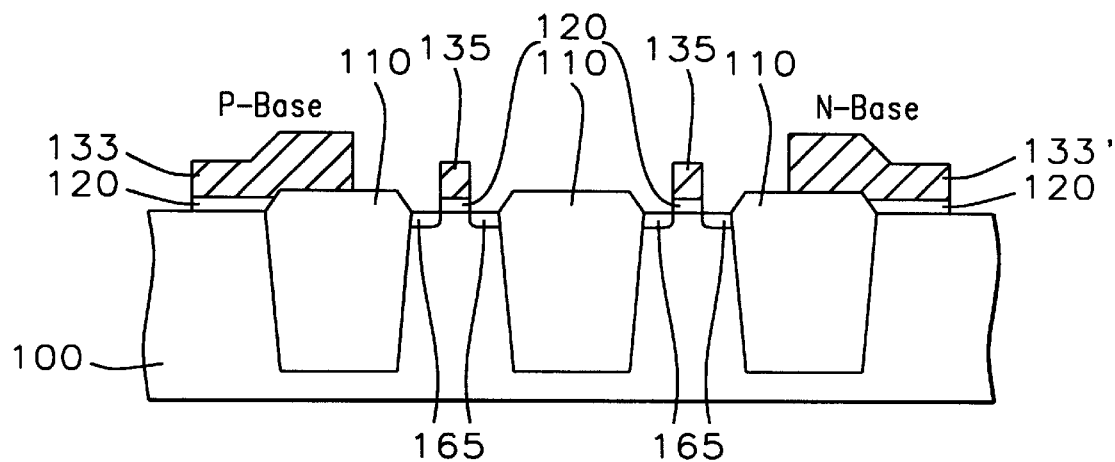
FIG. 2f is a cross-sectional view of a portion of a semiconductor substrate showing the N/P lightly doped drain (LDD) implant of the substrate of this invention.
Figure 2G:
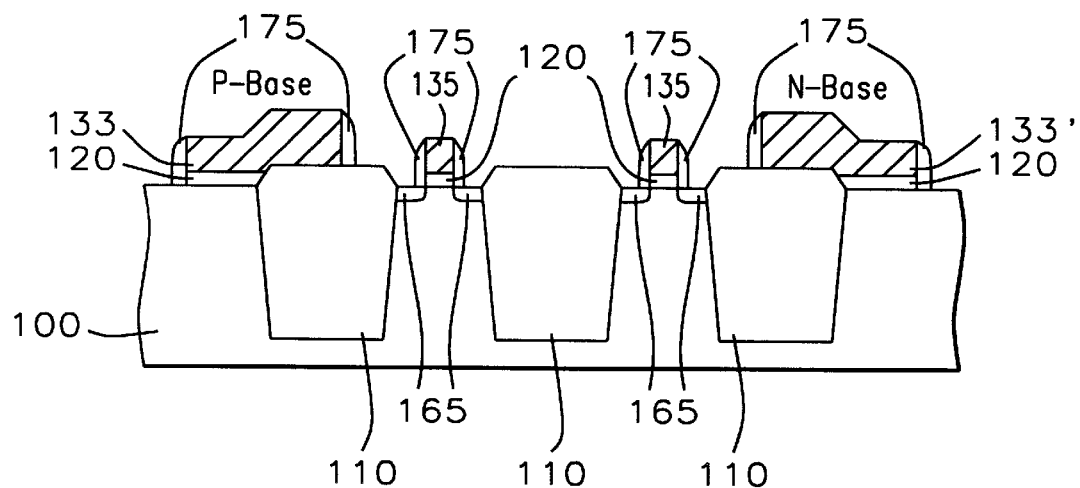
FIG. 2g is a cross-sectional view of a portion of a semiconductor substrate showing the forming of spacers on the floating structure and the floating gate, according to this invention.
Figure 2H:
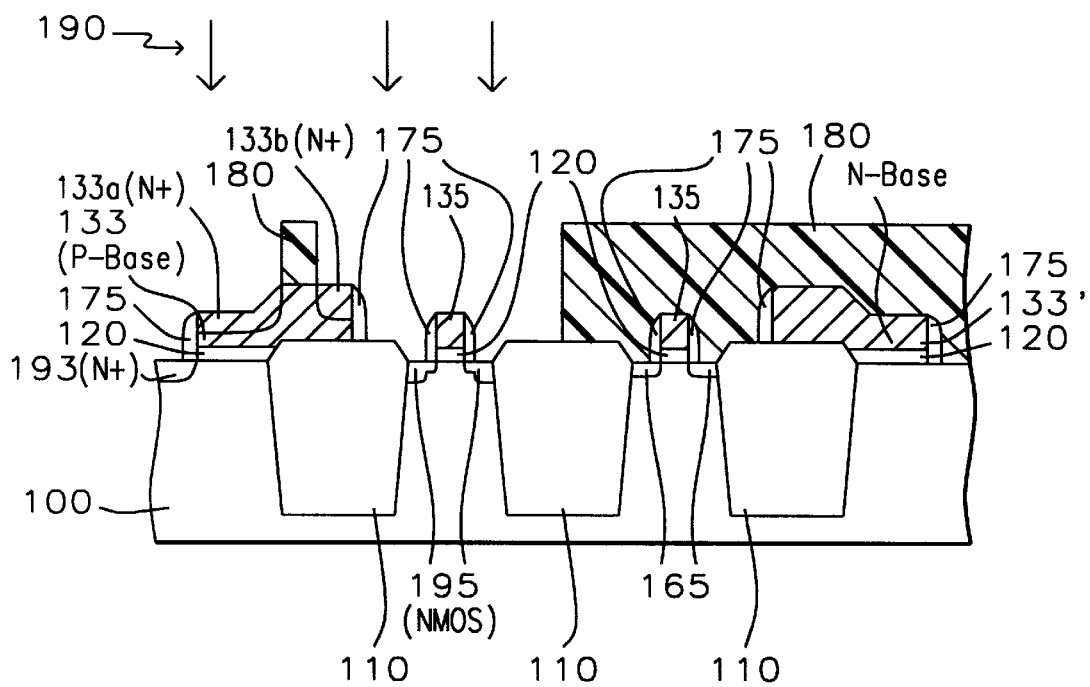
FIG. 2h is a cross-sectional view of a portion of a semiconductor substrate showing the N+ S/D (source/drain) and N+ E/C (emitter/collector) implant of the substrate of FIG. 2g, according to this invention.
Figure 2I:
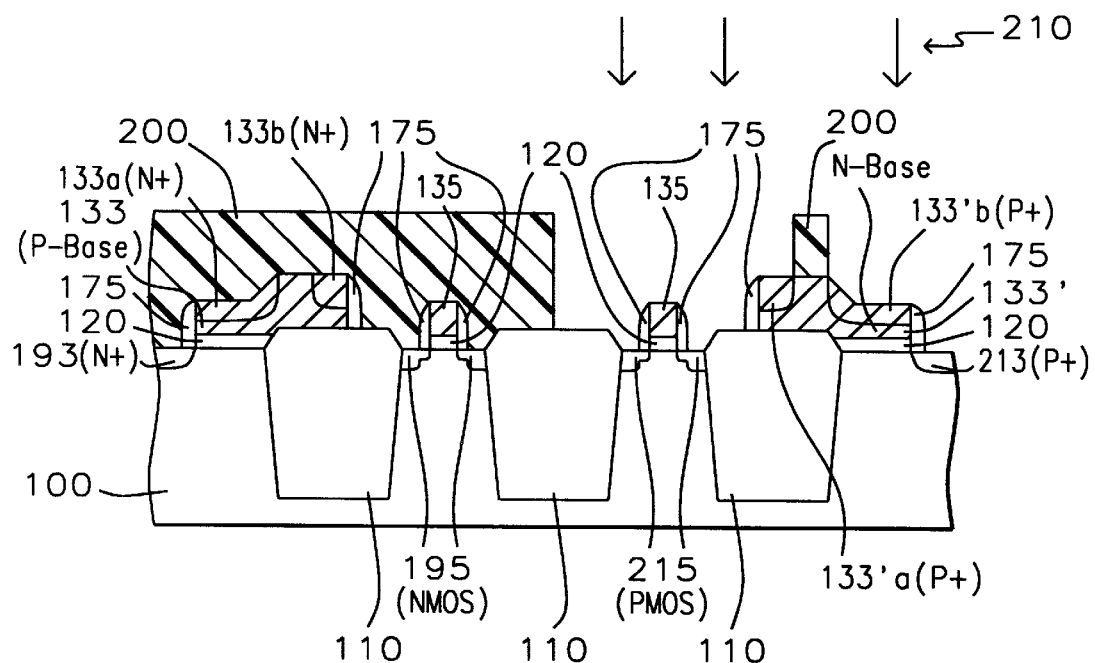
FIG. 2i is a cross-sectional view of a portion of a semiconductor substrate showing the P+ S/D and P+ E/C implant of the substrate of FIG. 2h, according to this invention.

Using conventional techniques, photoresist mask (150) is next formed over a portion of substrate (100) with an opening over bi-polar base (133) over a shallow trench isolation (110) to define floating N- base (133') of the protective thin-film bipolar device for the PMOS cell to be formed later as shown in FIG. 2i. It is important that the N-base of the floating polysilicon (133') shown in FIG. 2e is performed by implanting ions arsenic (As) or phosphorous (P) at a dosage level between about $5 \times 10^{13}$ to $1 \times 10^{15}$ atoms/cm$^2$ and at an energy level between about 10 to 70 KeV. Photoresist layer (150) is then removed as shown in FIG. 2f, using, for example, oxygen plasma ashing. Subsequently, a negative/positive (N/P) lightly doped drain (LDD) implant is performed using ions As or BF$_2$ at a dosage level between about $1 \times 10^{14}$ to $1 \times 10^{15}$ atoms/cm$^2$ and energy level between about 1 to 10 KeV to form drain (165), as shown in FIG. 2f.

Next, oxide spacers are formed along the vertical walls of the floating polysilicon structures, P-base (133) and N-base (133'), and polysilicon gates (135) as shown in FIG. 2g. The forming of spacers (175) is accomplished by depositing and anisotropically etching an oxide layer (not shown) and, preferably, they have a thickness between about 1500 to 3000 Å. The spacers will act to align the appropriate drains to be formed at a later step.

At the next step, photoresist mask (180) shown in FIG. 2h is formed, using conventional techniques, to cover that portion of substrate (100) over the earlier formed N-base floating structure (133') and the adjacent MOS device as shown in the same Figure. It is critical that photoresist layer (180) is patterned to protect a portion of P-base structure (133) to remain as P-base after the subsequent implanting step. As shown in FIG. 2h, the implanting is performed to form N+ source/drain (S/D) regions (193) and (195), and N+ emitter/collector (E/C) regions (133a) and (133b). For this purpose, it is preferred that ions As at a dosage level between about $1 \times 10^{15}$ to $1 \times 10^{16}$ atoms/cm$_2$ and at an energy level between about 10 to 100 KeV are used. Photoresist mask is then removed. It will be apparent to those skilled in the art that the floating N/P/N structure thusly formed will serve as a plasma damage protection cell for the neighboring NMOS cell.

Another photoresist mask (200) shown in FIG. 2i is formed, using the same conventional techniques as before, but to cover that portion of substrate (100) over the earlier formed N/P/N floating structure (133) and the adjacent NMOS device as showing in the same Figure. It is critical here also that photoresist layer (200) is patterned to protect a portion of N-base structure (133') to remain as N-base after the subsequent implanting step. As shown in FIG. 2i, the implanting is performed to form P+ source/drain (S/D) regions (213) and (215), and P+ emitter/collector (E/C) regions (133'a) and (133'b). For this purpose, it is preferred that ions boron (B) at a dosage level between about $1 \times 10^{15}$ to $1 \times 10^{16}$ atoms/cm$_2$ and at an energy level between about 1 to 10 KeV are used. Photoresist mask (200) is then removed. It will be apparent to those skilled in the art that the floating P/N/P structure thusly formed will serve as a plasma damage protection cell for the neighboring PMOS cell shown in FIG. 2j.

Figure 2J:
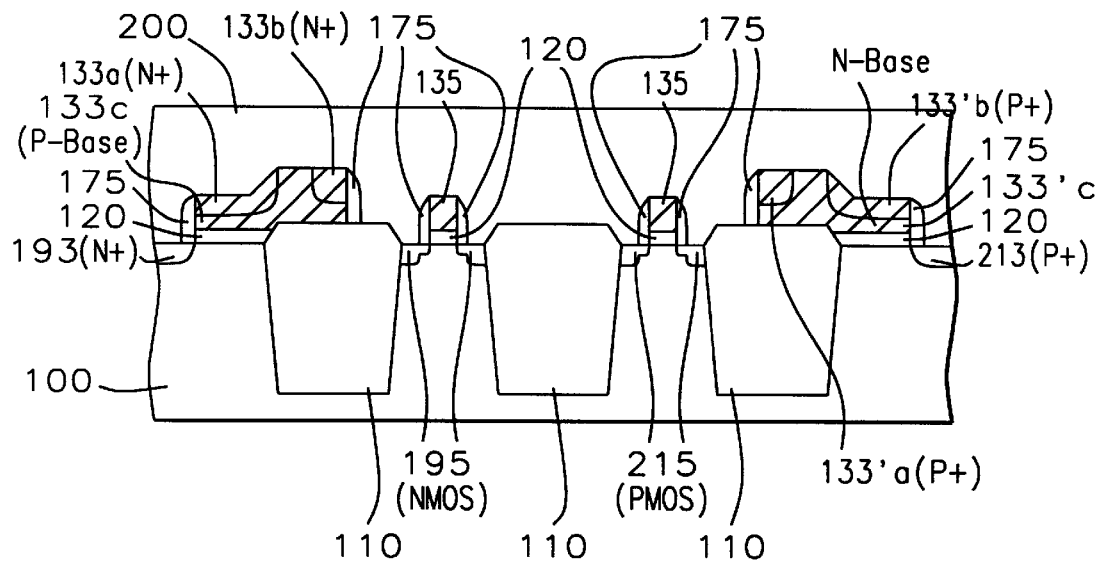
FIG. 2j is a cross-sectional view of a portion of a semiconductor substrate showing the forming of a dielectric layer, according to this invention.
Figure 2K:
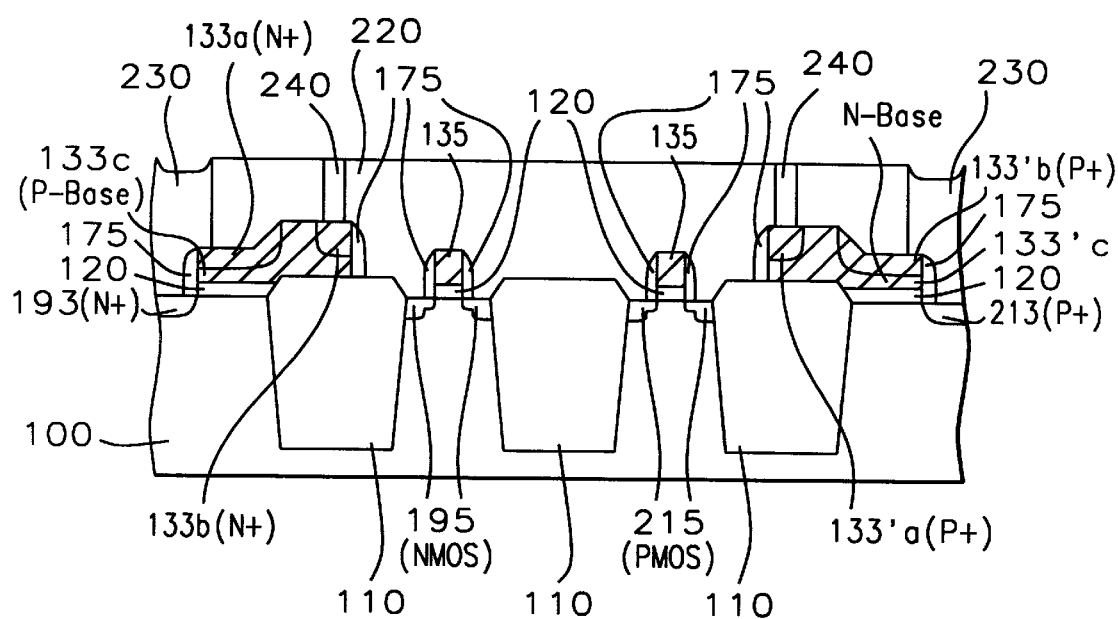
FIG. 2k is a cross-sectional view of a portion of a semiconductor substrate showing the forming of contacts of the floating N/P/N and P/N/P structures in the dielectric layer of FIG. 2j, according to this invention.

At the penultimate step of forming floating N/P/N and P/N/P structures of this invention, a layer of dielectric (220) is formed over substrate (100) as shown in FIG. 2j. Forming dielectric layers are known in the art. Blanket dielectric layers may be formed from materials including but not limited to silicon oxide materials, silicon nitride materials, and silicon oxynitrides materials formed within integrated circuits through methods including but not limited do chemical vapor deposition (CVD), plasma enhanced CVD (PECVD), or, physical vapor deposition (PVD) sputtering methods. For the preferred embodiment of the present invention, the blanket dielectric layer (220) is preferably formed of a dielectric material chosen from the group of dielectric materials consisting of silicon oxide dielectric materials, silicon nitride, and silicon oxynitride. Preferably, dielectric layer (220) has a thickness between about 1000 to 9000 Å. The dielectric layer is then planarized using the well-known chemical-mechanical polishing (CMP) techniques before contacts are formed as a final step. Contacts (230) and (240) of the floating N/P/N and P/N/P structures of this invention are formed within dielectric layer (220) as shown in FIG. 2k using conventional methods.

Though these numerous details of the disclosed method are set forth here, such as process parameters, to provide an understanding of the present invention, it will be obvious, however, to those skilled in the art that these specific details need not be employed to practice the present invention to arrive at the floating N/P/N and P/N/P structures which serve to protect MOS devices. The structures are novel comprising a base portion, an emitter portion, and a collector portion which partially cover a shallow trench isolation region and a drain. N/P/N structure overlaps N+ drain while P/N/P structure overlaps P+ drain while each, respectively, protecting a neighboring NMOS and a PMOS device from plasma damage.

While the invention has been particularly shown and described with reference to the preferred embodiments thereof, it will be understood by those skilled in the art that various changes in form and details may be made without departing from the spirit and scope of the invention.

What is claimed is:

1. A method of forming a plasma damage protection cell using floating N/P/N and P/N/P structure comprising the steps of:

providing a silicon substrate having a plurality of active and field regions defined;

forming shallow trench isolation (STI) in said substrate;

forming a gate oxide layer over said substrate;

forming a polysilicon layer over said gate oxide layer;

performing thin-film bipolar P-base implant;

forming a polysilicon floating structure over said STI and a polysilicon floating gate over said gate oxide adjacent said STI;

performing thin-film bipolar N-base implant;

performing N/P lightly doped drain (LDD) implant;

forming oxide spacer;

performing N+ source/drain (S/D) and N+ emitter/collector (E/C) implant;

performing P+ source/drain (SID) and P+ emitter/collector (E/C) implant;

forming interlevel dielectric layer and performing chemical-mechanical polishing (CMP); and forming contact pattern.

2. The method of claim 1, wherein said gate oxide layer has a thickness between about 15 to 100 Å.

3. The method of claim 1, wherein said forming said polysilicon layer is accomplished by using silane SiH$_4$ as a silicon source material at a temperature range between about 400 to 700° C.

4. The method of claim 1, wherein said polysilicon layer has a thickness between about 1500 to 3000.

5. The method of claim 1, wherein said performing said thin-film bipolar P-base implant is accomplished with ions $BF_2$ at a dosage level between about $1\times10^{13}$ to $1\times10^{15}$ atoms/$cm_2$ and at an energy level between about 2 to 10 KeV.

6. The method of claim 1, wherein said performing said thin-film bipolar N-base implant is accomplished with ions As at a dosage level between about $5\times10^{13}$ to $1\times10^{15}$ atoms/$cm_2$ and at an energy level between about 10 to 70 KeV.

7. The method of claim 1, wherein said performing said N/P lightly doped drain (LDD) implant is accomplished with ions As or $BF_2$ at a dosage level between about $1\times10^{14}$ to $1\times10^{15}$ atoms/$cm^2$ and at an energy level between about 10 to 60 KeV.

8. The method of claim 1, wherein said performing said N+ source/drain (SID) and N+ emitter/collector (E/C) implant is accomplished with ions As at a dosage level between about $1\times10^{15}$ to $1\times10^{16}$ atoms/$cm^2$ and at an energy level between about 10 to 100 KeV.

9. The method of claim 1, wherein said performing said P+ source/drain (S/D) and P+ emitter/collector (E/C) implant is accomplished with ions B at a dosage level between about $1\times10^{15}$ to $1\times10^{16}$ atoms/$cm_2$ and at an energy level between about 1 to 10 KeV.

10. The method of claim 1, wherein said interlevel dielectric has a thickness between about 1000 to 9000 Å.

* * * * *